United States Patent
Tao et al.

(10) Patent No.: US 8,300,491 B2
(45) Date of Patent: Oct. 30, 2012

(54) MULTIPLE BITCELLS TRACKING SCHEME FOR SEMICONDUCTOR MEMORIES

(75) Inventors: Derek C. Tao, Fremont, CA (US); Annie-Li-Keow Lum, San Jose, CA (US); Chung-Ji Lu, Fongyuan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 148 days.

(21) Appl. No.: 12/868,909

(22) Filed: Aug. 26, 2010

(65) Prior Publication Data

US 2012/0051160 A1 Mar. 1, 2012

(51) Int. Cl.
*G11C 8/00* (2006.01)

(52) U.S. Cl. ............... 365/230.03; 365/191; 365/230.01; 365/233.1

(58) Field of Classification Search ............. 365/230.03, 365/191, 230.01, 233.1

See application file for complete search history.

(56) References Cited

U.S. PATENT DOCUMENTS

| | | | |
|---|---|---|---|
| 5,265,047 A | 11/1993 | Leung et al. | |
| 6,014,338 A | 1/2000 | Wang et al. | |
| 6,285,604 B1 | 9/2001 | Chang | |
| 6,731,534 B1 * | 5/2004 | Fan | 365/154 |
| 6,985,398 B2 * | 1/2006 | Oh | 365/230.03 |
| 7,215,588 B2 | 5/2007 | Lee et al. | |
| 7,474,579 B2 * | 1/2009 | Bill et al. | 365/222 |
| 7,577,052 B2 * | 8/2009 | Wu et al. | 365/226 |
| 7,630,230 B2 * | 12/2009 | Wong | 365/154 |
| 7,733,686 B2 * | 6/2010 | Clinton | 365/154 |
| 2008/0198680 A1 | 8/2008 | Park | |
| 2009/0231934 A1 | 9/2009 | Jung et al. | |
| 2009/0290446 A1 | 11/2009 | Cheng et al. | |

OTHER PUBLICATIONS

Singh, J. et al., "Single Ended 6T SRAM with Isolated Read-Port for Low-Power Embedded Systems", Design, Automation & Test in Europe Conference & Exhibition, Apr. 20-24, 2009, pp. 917-922.

* cited by examiner

*Primary Examiner* — Pho M Luu
(74) *Attorney, Agent, or Firm* — Duane Morris LLP

(57) ABSTRACT

A semiconductor memory segment includes a first memory bank having a first tracking cell disposed in a first tracking column. A second memory bank includes a second tracking cell disposed in a second tracking column. A first tracking circuit is coupled to the first and second tracking cells and is configured to output a first signal to memory control circuitry when the first and second tracking cells are accessed. The memory control circuitry is configured to set a clock based on the first signal.

20 Claims, 8 Drawing Sheets

MULTIPLE BITCELLS TRACKING SCHEME FOR SEMICONDUCTOR MEMORIES

FIELD OF DISCLOSURE

The disclosed circuit and method relate to semiconductor memories. More specifically, the disclosed circuit and method relate to tracking multiple bit cells in semiconductor memories.

BACKGROUND

Semiconductor memory devices are continually shrinking in size while at the same time increasing in density or volume and operate at lower power. The operation of memory devices are synchronized based on clock signals, which may reach different parts of a memory device at different times. The difference in signal paths results in various problems including having a reduced read time margin, which may lead to data being improperly read from the memory.

One example of a semiconductor memory device, a static random access memory (SRAM), includes a plurality of memory cells arranged in rows and columns. Each memory cell typically includes four or six transistors that form a latch for storing a bit of information. Additionally, each memory cell is connected to one of a plurality of write word lines (WWL) and one of a plurality of read word lines (RWL), both of which extend horizontally across an SRAM array forming a plurality of rows. The memory cells are also coupled to one of a plurality of differential write bit line including WBL and its inverse WBL_. A read bit line (RBL) is also coupled to the memory cells. WBL, WBL_, and RBL all extend vertically across the SRAM array to form a plurality of columns.

Data is written to the memory cells by controlling the voltages on the WWL and providing the data on bit lines WBL and WBL_ to be transferred to the storage node. Data is read from the memory cells by controlling the voltage of the RWL and sensing the resultant voltage that develops on the RBL. The process of writing data to and reading data from the memory cells takes a certain amount of time, which varies based on the distance between the memory cell and the memory controller as well as on the variances across the SRAM due to process, voltage, and temperature ("PVT").

Consequently, SRAM arrays, and other semiconductor memories such as dynamic random access memories ("DRAMs"), also include tracking circuitry to detect delays in signals transmitted through the array. The delays detected through the use of tracking signals are used to adjust the timing of the memory control signals to help ensure the read time margin is sufficiently long such that data may be properly read from the memory. Although multiple bit cell tracking methods have been implemented to reduce the variations (e.g., in threshold voltage, in memory cell read current, etc.) across the SRAM, problems still arise when the memory is implemented for high voltage and high speed SRAMs. In these situations, the tracking may be too fast for low $V_{DD}$ operation due to different threshold voltages ($V_T$) between the logic and the bit lines. Additionally, in some approaches, if the tracking methodology is implemented for low $V_{DD}$ operation, then the tracking may result in too high a read time margin and therefore will not be optimized for normal $V_{DD}$ operation.

DETAILED DESCRIPTION

In some embodiments, a semiconductor memory includes an improved bit cell tracking system and method. The improved bit cell tracking system and method include tracking multiple tracking bit cells in multiple tracking paths each of which includes at least one tracking bit cell. A tracking clock provides a clock signal through the tracking path to reset the internal clock pulse that, for example, controls the cycle time of the memory.

Figure 1:
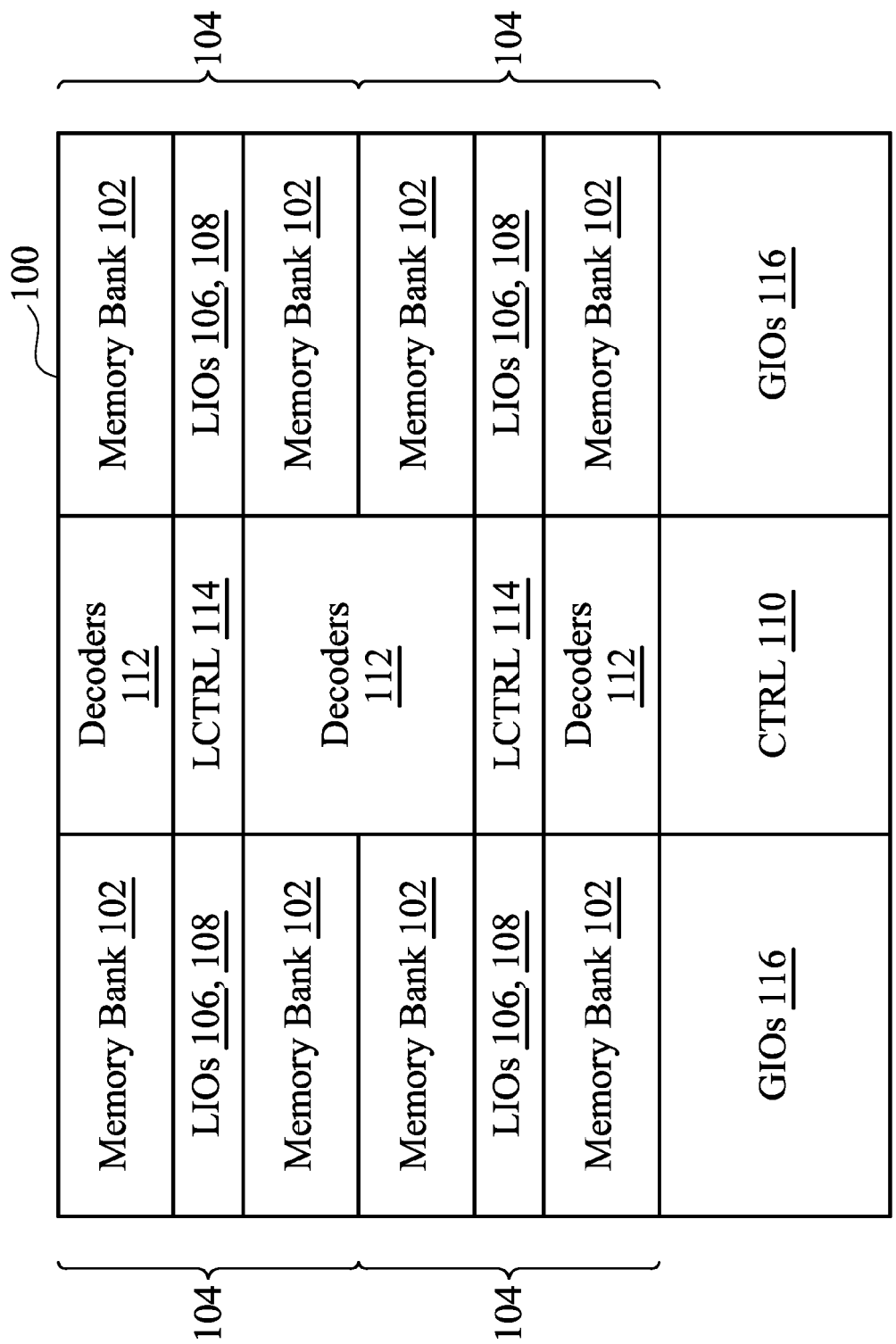
FIG. 1 illustrates a layout of a semiconductor memory in accordance with some embodiments.

FIG. 1 illustrates a static random access memory ("SRAM") array 100 including a plurality of banks 102 of memory cells. Although an SRAM array is described, one skilled in the art will understand that the disclosed system and method may be adapted for other semiconductor memories including, but not limited to, dynamic random access memories ("DRAMs"), erasable programmable read only memories ("EPROMs"), and electronically erasable programmable read only memories ("EEPROMs") as well as other read only memories ("ROMs"), random access memories ("RAMs"), and flash memories. SRAM array 100 may be divided into one or more segments 104 with each segment 104 including a plurality of memory cell banks 102 separated by local input/output (LIO) circuitry 106, 108. The reading from and writing to the memory cell banks 102 is controlled by global control ("GCTRL") circuitry 110, which is coupled to address decoders 112, local control ("LCTRL") circuitry 114, and global input/output ("GIO") circuitry 116. For example, GCTRL circuitry 110, which may include a tracking clock (not shown) as well as a clock (not shown) for controlling the reading and writing to and from memory cells of the SRAM 100, provides an address and a control signal for reading data from or writing data to a memory cell in one of the segments 104. The address is decoded by one of the decoders 112 and LCTRL circuitry 114 identifies the type of operation being performed and transmits a signal to an LIO 106, 108 for controlling the data access in a segment 104.

Figure 2:
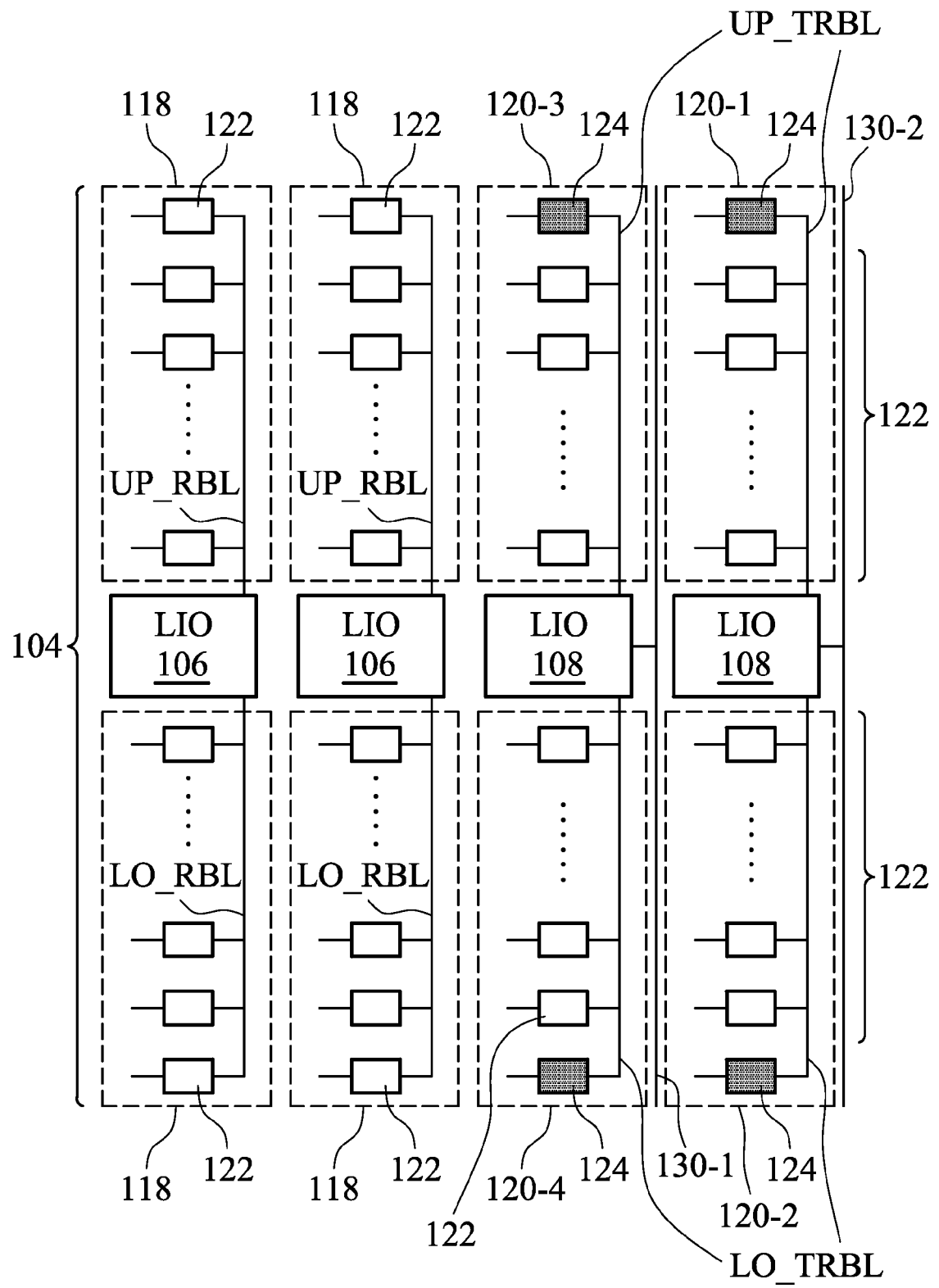
FIG. 2 illustrates a layout of a partial segment of a semiconductor memory in accordance with some embodiments.

FIG. 2 illustrates a more detailed view of one example of a segment 104 of SRAM 100. As shown in FIG. 2, segment 104 includes a plurality of columns 118 and 120 of memory cells 122 arranged in rows and coupled to LIO 106. Memory cells 122 disposed in columns 118 disposed above LIOs 106 are coupled to read bit line UP_RBL, and memory cells 122 disposed in columns 118 below the LIOs 106 are coupled to read bit line LO_RBL.

Tracking columns 120-1:120-4 (collectively "tracking columns 120") also include a plurality of memory cells 122 aligned in a plurality of rows coupled to a tracking LIO 108. Each of the tracking columns 120 also includes a tracking memory cell 124 coupled to a tracking read bit line ("TRBL"), i.e., either UP_TRBL or LO_TRBL, which is a bit line used for routing tracking signals through the SRAM as described below. As illustrated in FIG. 2, the memory cells 122 and tracking memory cells 124 in tracking columns 120-1 and 120-3, which are located above LIOs 108, are coupled to tracking read bit lines UP_TRBL, and the memory cells and tracking memory cells 124 in tracking columns 120-2 and 120-4, which are disposed below LIOs 108, are coupled to tracking read bit lines LO_TRBL. UP_TRBL and LO_TRBL, via the output of tracking LIOs 108, are coupled to a global bit line ("GBL") 130.

Figure 3:
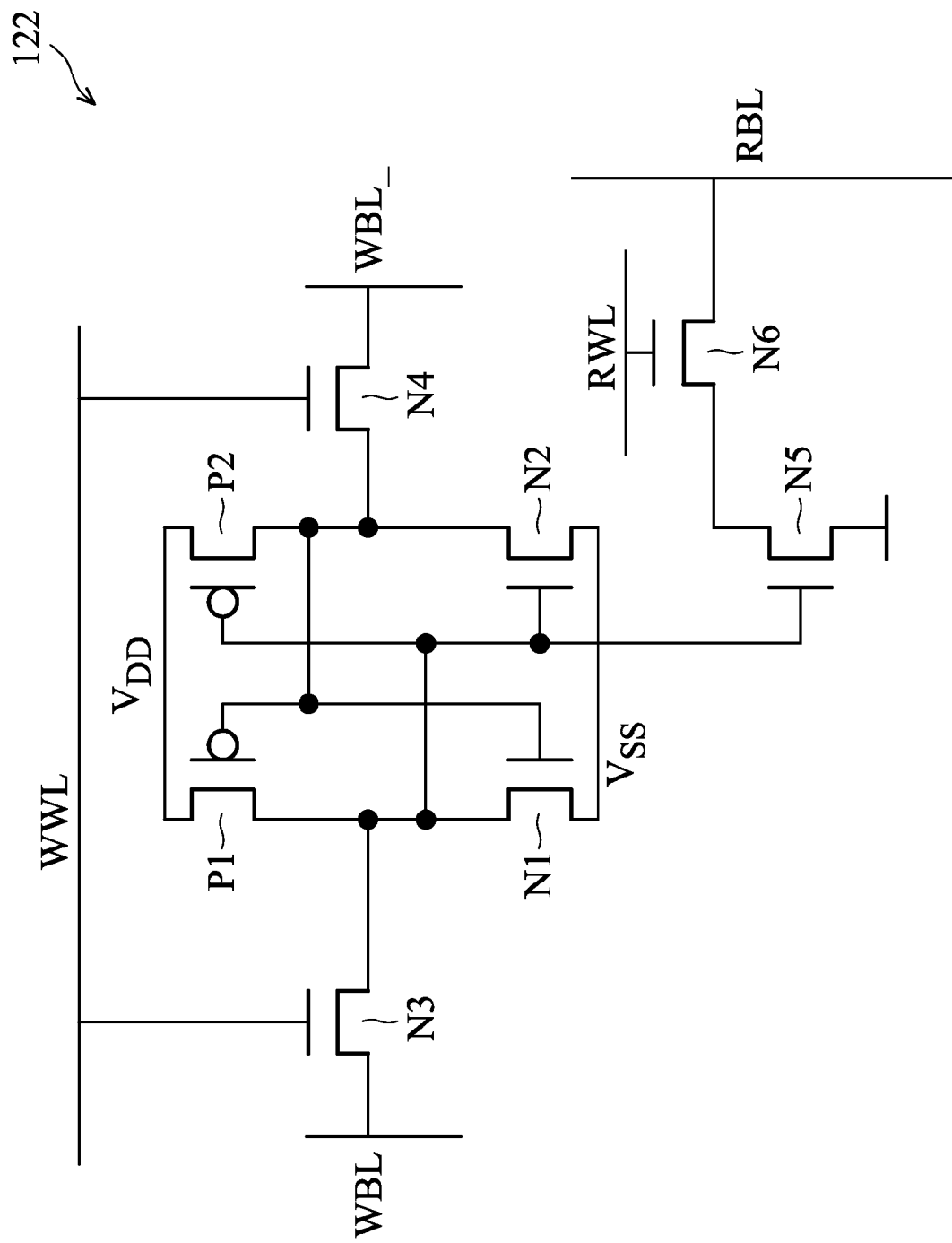
FIG. 3 is a schematic view of one example of a memory cell in accordance with some embodiments of a semiconductor memory.

FIG. 3 illustrates one example of a single-ended SRAM memory cell 122. As shown in FIG. 3, memory cell 122 includes two PMOS transistors P1 and P2 and six NMOS transistors N1-N6. Each memory cell 122 is connected to one of a plurality of write word lines (WWL) and one of a plurality of read word lines (RWL), both of which extend horizontally across an SRAM array forming a plurality of rows. Memory cell 122 is also coupled to one of a plurality of differential write bit line including WBL and its inverse WBL_. A read bit line (RBL) is also coupled to memory cell 122. WBL, WBL_, and RBL all extend vertically across the SRAM array 100 to form a plurality of columns 118, 120.

Memory writing is accomplished by placing a high level (e.g., a logic one) on the addressed WWL and the desired logic level on the write bit lines WBL and WBL_. The desired value is latched through pass NMOS transistors N3 and N4 where it is then stored at a storage node disposed between transistors P1-P2 and N1-N2. Memory reading is accomplished by accessing the value stored at the storage node by placing a high level on the addressed RWL and detecting the logic level on the RBL through NMOS transistor N6.

Figure 4:
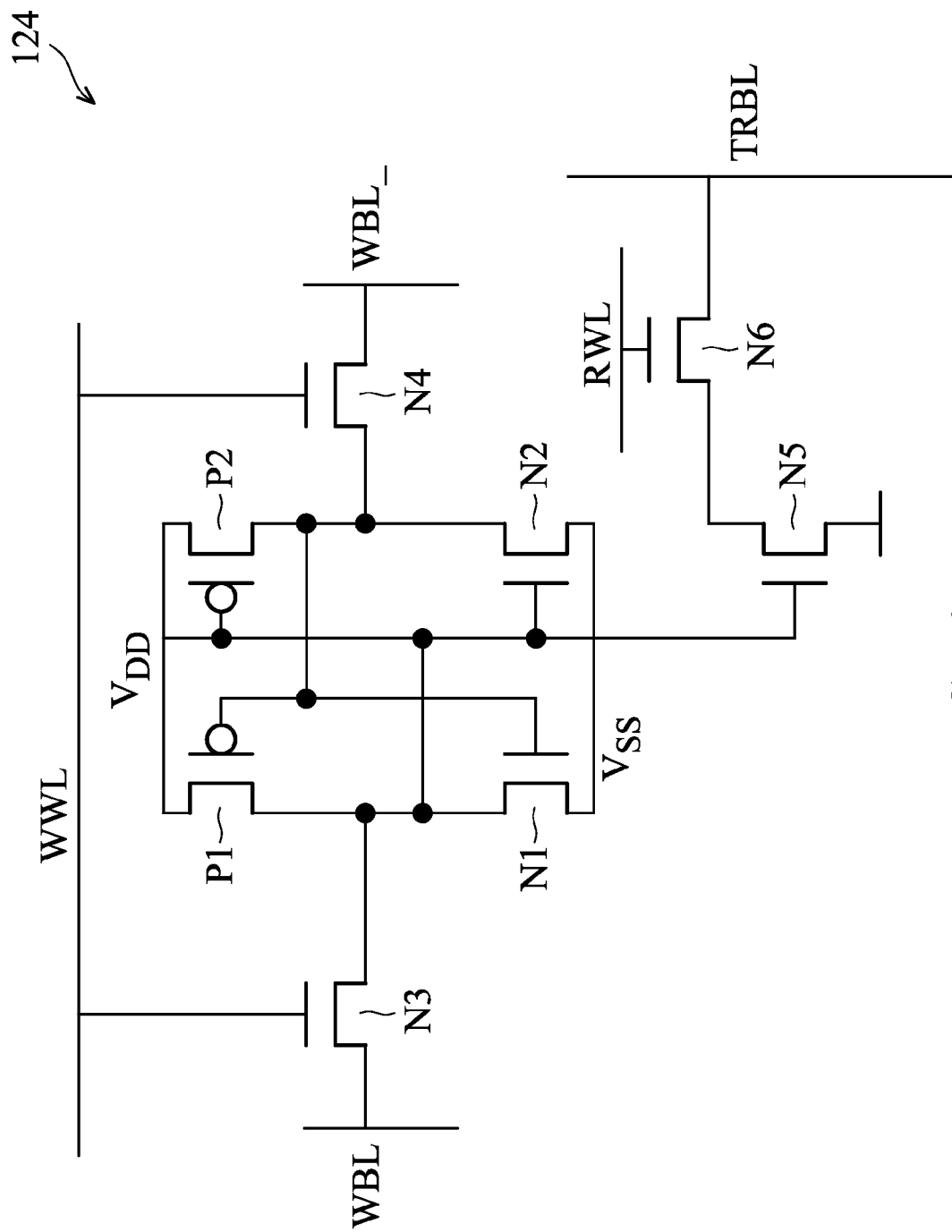
FIG. 4 is a schematic view of one example of a tracking bit cell in accordance with the semiconductor memory illustrated in FIG. 1.

FIG. 4 illustrates one example of a single-ended tracking cell 124. As shown in FIG. 4, single-ended tracking cell 124 is similar to memory cell 122 except that the gates of transistors P2, N2, and N5 are coupled to positive supply voltage $V_{DD}$ such that NMOS transistors N2 and N5 are always in an "on" or current conducting state and PMOS transistor P2 is always in an "off" or non-current conducting state. Additionally, tracking cell 124 is coupled to a TRBL, i.e., UP_TRBL or LO_TRBL, instead of to read bit lines UP_RBL or LO_RBL. Consequently, read tracking cells 124 may be accessed by placing a high logic level on the RWL, which results in the stored data being read by detecting the logic level at the TRBL.

Figure 5:
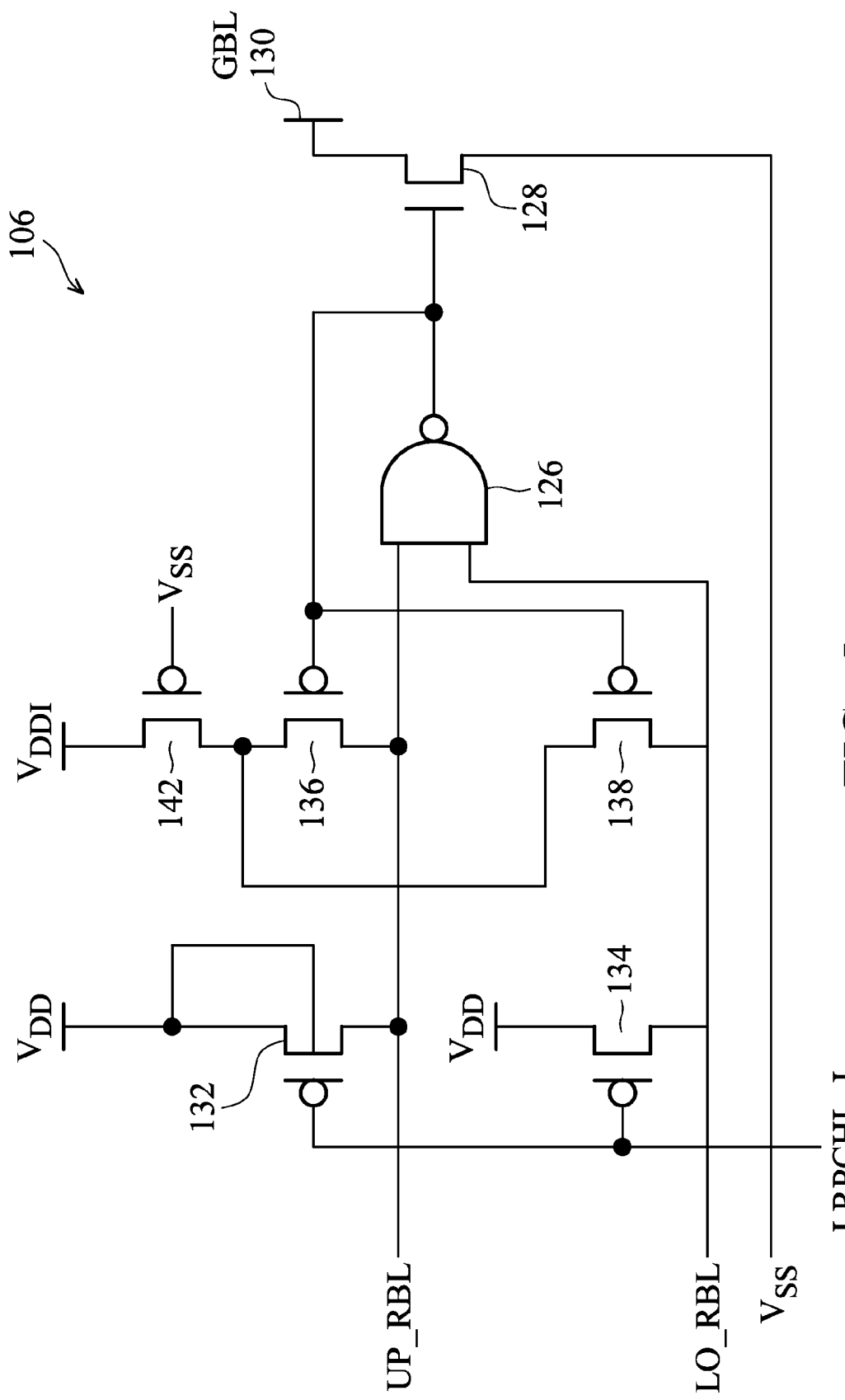
FIG. 5 illustrates one example of a local input/output circuit in accordance with some embodiments.

One example of an LIO 106 is illustrated in FIG. 5. As shown in FIG. 5, LIO 106 includes a NAND logic gate 126 having a first input coupled to a first RBL, which may be disposed above LIO 106 as illustrated in FIG. 2 and is thus identified as UP_RBL, and a second input coupled to a second RBL disposed below LIO 6 and is identified as LO_RBL. The output of NAND gate 126 is coupled to GBL 130 through transistor 128. Transistors 132-138 and 142 are coupled to positive voltage supply $V_{DD}$ and negative voltage supply $V_{SS}$ to provide the appropriate logic voltage levels to NAND gate 126.

Figure 6:
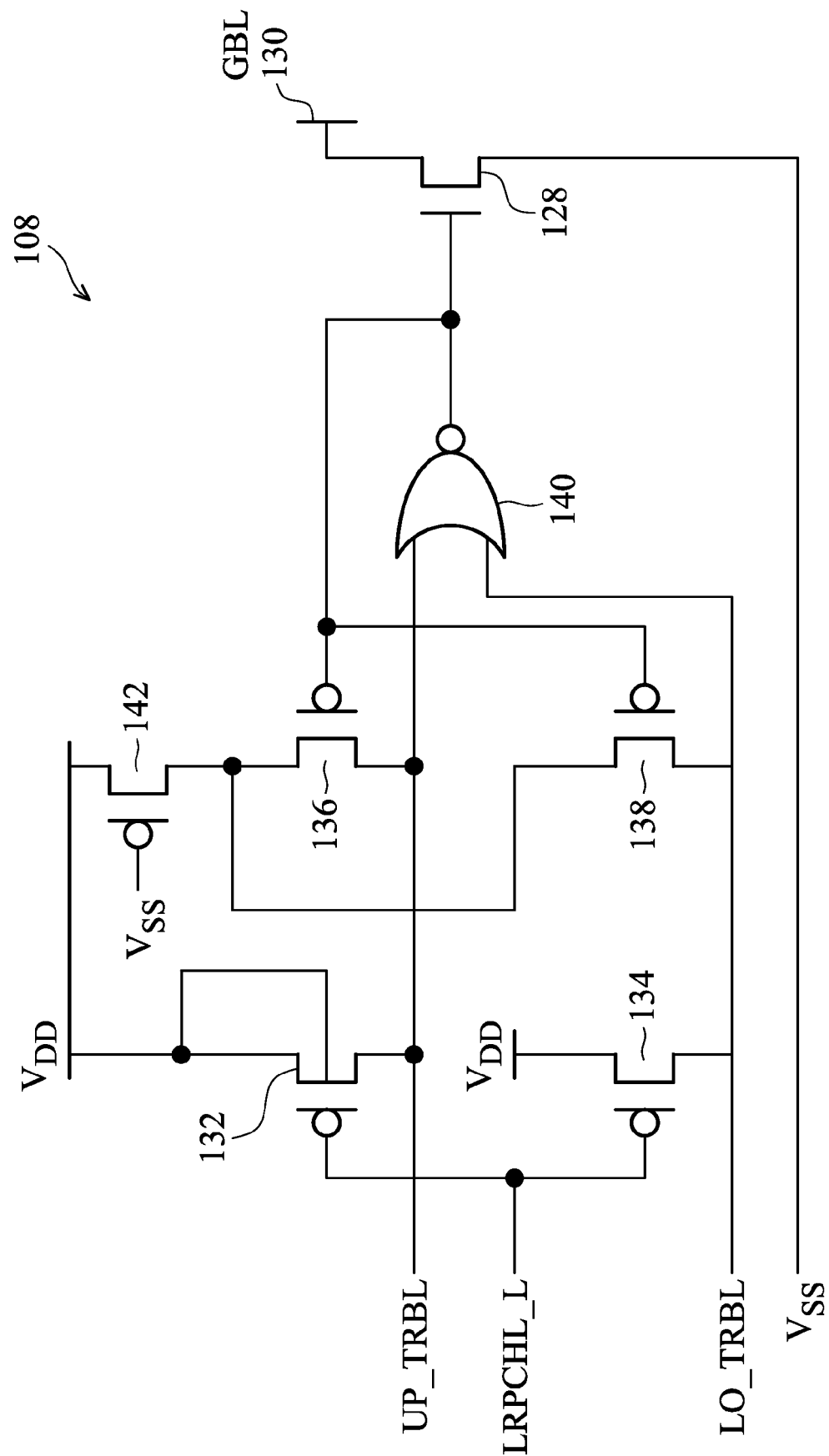
FIG. 6 illustrates one example of a tracking local input/output circuit in accordance with some embodiments.

An example of a tracking LIO 108 is illustrated in FIG. 6. As shown in FIG. 6, LIO 108 differs from LIO 106 in that LIO 108 includes a NOR gate 140 having a first input coupled to tracking read bit line UP_TRBL, and a second input coupled to tracking read bit line LO_TRBL. In a normal state in which data is not being read from or written to memory cells 122 and tracking cells 124, UP_TRBL and LO_TRBL are both precharged to the voltage of positive voltage source $V_{DD}$ through transistors 132, 134, 136, 138, and 142, which provide the logic levels for NOR gate 140. The operation of NOR gate 140 is such that both inputs must be a logic low before its output is a logic high. The output of NOR gate 140 is coupled to the gate of transistor 128, which has its drain coupled to global bit line 130 and its source coupled to negative or low supply voltage $V_{SS}$. When the output of NOR gate 140 is high, transistor 128 is on resulting in the voltage level at the drain of transistor 128, which is coupled to GBL 130, being pulled to the logic level at its source. As a result, GBL 130 is pulled to ground or $V_{SS}$. When the output of NOR gate 140 is low, transistor 128 is off and $V_{SS}$ is electrically disconnected from GBL 130.

Figure 7:
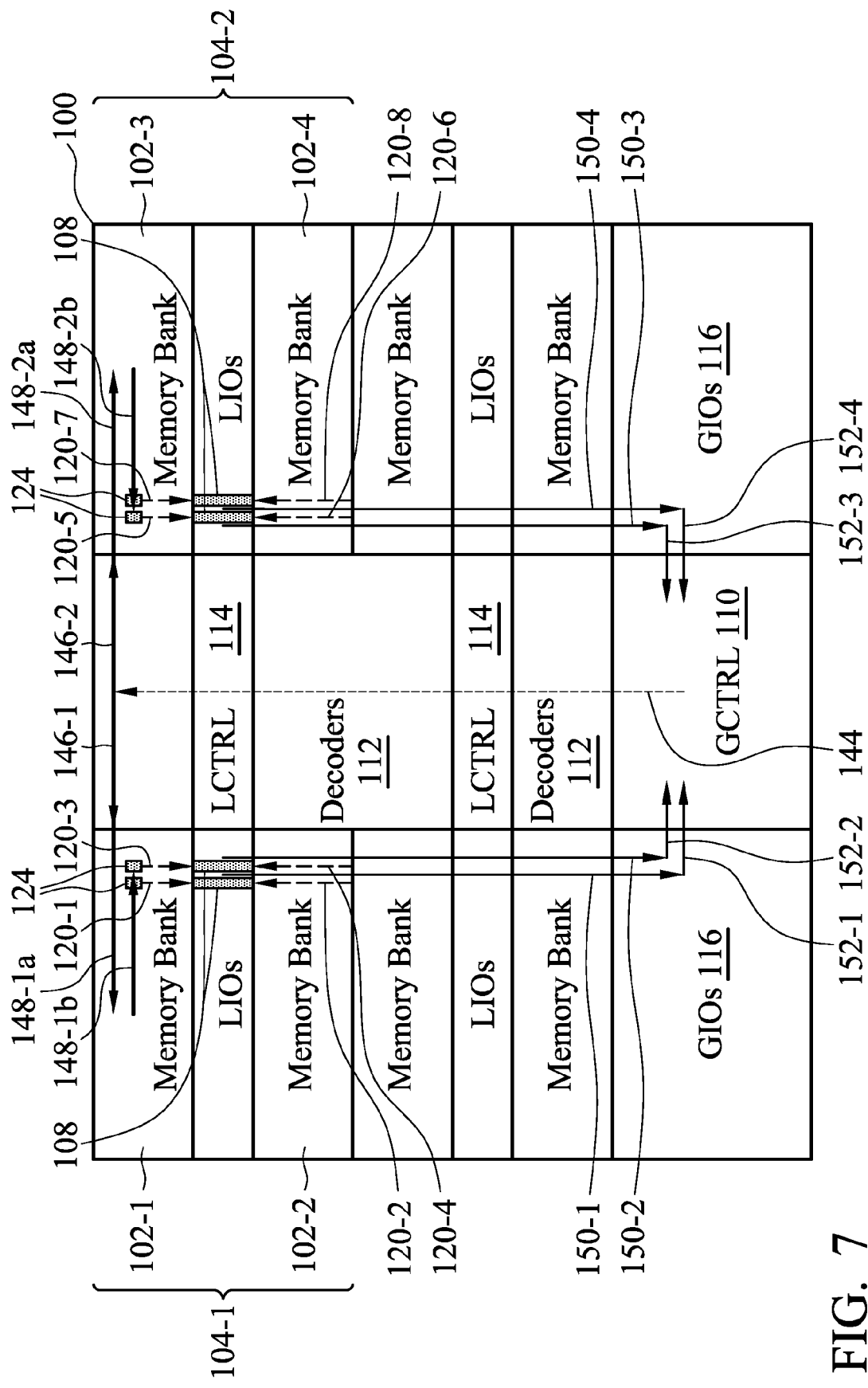
FIG. 7 illustrates an improved tracking process of a semiconductor memory in accordance with some embodiments.
Figure 8:
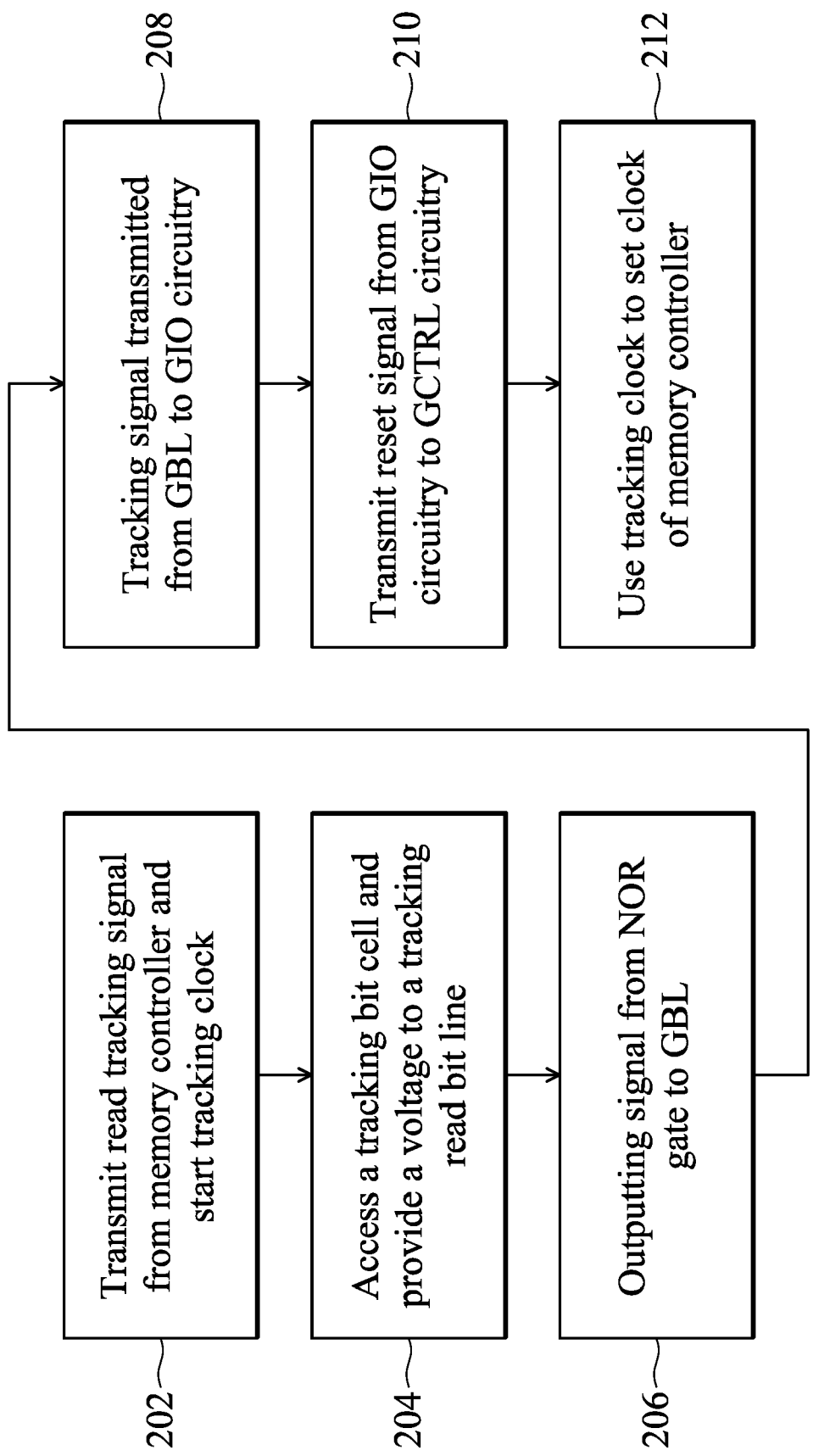
FIG. 8 illustrates one example of a flow chart of a method of read bit line tracking in accordance with some embodiments.

FIG. 7 illustrates one example of an improved bit line read tracking process in accordance with the SRAM array illustrated in FIG. 1 in which four tracking paths are tested, and FIG. 8 is a flow chart illustrating one example of a method 200 of read bit line tracking. At block 202, a read tracking control signal 144 is transmitted from GCTRL circuitry 110, which also starts a tracking clock (not shown). The read tracking control signal is routed through a series of decoders 112 and LCTRL circuitry 114 to word line drivers 146-1 and 146-2, which are coupled to decoders 112. Word line drivers 146-1 and 146-2 are coupled to word lines 148-1 and 148-2 in segments 104-1 and 104-2, and a signal travels along a first half of word lines 148-1 and 148-2 as denoted by lines 148-1*a* and 148-2*a* in FIG. 7. The signal then travels back along word lines 148-1 and 148-2 as denoted by lines 148-1*b* and 148-2*b* to tracking cells 124, which are disposed in columns adjacent to LCTRLs 114 and decoders 112. Locating tracking columns 120 with tracking cells 124 adjacent to decoders 112 and LCTRL circuitry 114 advantageously enables the speed of the memory to be increased and simplifies the implementation of the SRAM. The signal traveling half way along word lines 148-1 and 148-2 and then returning along the same word line simulates a signal traveling across an entire word line representing a typical condition in accordance with some embodiments. Although FIG. 7 illustrates that a read tracking cell travels half-way along word lines 148-1 and 148-2, one skilled in the art will understand that read tracking signal may be routed farther or shorter along word lines 148-1 and 148-2 and that tracking columns 120-1:120-8 may be positioned at different locations within memory banks 102 in segments 104.

When the signal from word lines 148-1 and 148-2 passes through tracking cells 124 to access the tracking cells 124 at block 204, NMOS transistors N5 and N6 are on resulting in transistor N6 pulling the tracking read bit line (either UP_TRBL or LO_TRBL), which is coupled to the drain of transistor N6, to the drain of transistor N5. Transistor N5 being on results in the drain of transistor N5 being pulled to the logic level of the source of transistor N5, which is coupled to ground. The effect of the switching of transistors N5 and N6 is to pull the tracking read bit line to ground or low.

Before LIO 108 is accessed, UP_TRBL and LO_TRBL are charged to $V_{DD}$ and provide the inputs of NOR gate 140 with logic ones such that the output of NOR gate 140 is a logic zero. When the tracking signal passes through LIO 108, both UP_TRBL and LO_TRBL will be pulled to ground as described above, but one will be faster or slower than the other. When both UP_TRBL and LO_TRBL are low at block 206, the output of NOR gate 140 changes from low to high, which turns on transistor 128. With transistor 128 on, the drain of transistor 128 that is coupled to GBL 130 is pulled to the logic level of the source of transistor 128 causing GBL 130 to be low. In effect, the slower or slowest signal (either UP_TRBL or LO_TRBL) causes GBL 130 to be pulled to ground.

Global bit lines 130 transmit signals 150 to GIOs 116 at block 208. At block 210, GIOs 116 transmit a reset signal 152 to GCTRL circuitry 110. The tracking clock (not shown) of GCTRL circuitry 110 may be used to program the memory clock (not shown) for SRAM array 100 based on the latest reset signal 152 to be received by the tracking clock at block 212.

In some embodiments, a semiconductor memory includes a first segment comprising a first memory bank having a first plurality of memory cells arranged in rows and columns and a first tracking cell disposed in a first tracking column. A second memory bank includes a second plurality of memory cells arranged in rows and columns and a second tracking cell disposed in a second tracking column. A first tracking circuit is coupled to the first and second tracking cells and is configured to output a first signal to memory control circuitry when the first and second tracking cells are accessed. The memory control circuitry is configured to set a memory clock based on the first signal.

In some embodiments, a method includes starting a tracking clock when a tracking signal is transmitted from a memory control circuit of a semiconductor memory. A first voltage from a first tracking cell disposed in a first column of a first segment of the semiconductor memory is used to control a first tracking read bit line in response to receiving the tracking signal. A second voltage is from a second tracking cell disposed in a second column of the first segment of the semiconductor memory is used to control a second tracking read bit line in response to receiving the tracking signal. A first signal is output to a tracking global bit line from a first tracking circuit in response to receiving the first and second voltages from the first and second tracking read bit lines, and a first reset signal for triggering a reset of the tracking clock is generated when the first signal is received from the tracking global bit line.

In some embodiments, a semiconductor memory is disclosed that includes a plurality of segments. Each of the plurality of segments includes first and second banks of memory cells in which the memory cells are arranged in rows and columns. A local tracking circuit is disposed between the first and second banks of memory cells. The local tracking circuit includes a NOR gate having a first input coupled to a first tracking read bit line and a second input coupled to a second tracking read bit line. The first tracking read bit line is coupled to a first tracking cell disposed in a first column of the first bank, and the second tracking read bit line is coupled to a second tracking cell disposed in a second column of the second bank. The NOR gate has an output coupled to a global tracking bit line and is configured to trigger a reset of a tracking clock coupled to the global tracking bit line in response to receiving signals identifying that the first and second tracking cells have been accessed from the first and second tracking read bit lines.

The semiconductor memory and tracking method disclosed herein advantageously provide a plurality of tracking paths across a semiconductor memory thereby enabling the independent tracking of the plurality of tracking bit cells positioned across the memory. The local bit line tracking described herein also provides bit cell tracking that closely approximates bit cell reading across the array for all process, voltage, and temperature conditions to enable a better yield than conventional semiconductor memories and tracking methodologies.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor memory, comprising:
   a first segment including:
   a first memory bank comprising a first plurality of memory cells arranged in rows and columns and a first tracking cell disposed in a first tracking column,
   a second memory bank comprising a second plurality of memory cells arranged in rows and columns and a second tracking cell disposed in a second tracking column that is aligned with the first tracking column such that the first and second tracking cells are aligned with each other in a first direction, and
   a first tracking circuit coupled to, and disposed between, the first and second tracking cells and configured to output a first signal to memory control circuitry when the first and second tracking cells are accessed;
   wherein the memory control circuitry is configured to set a memory clock based on the first signal.

2. The semiconductor memory of claim 1, wherein the first tracking circuit includes a NOR gate coupled to the first tracking column and to the second tracking column.

3. The semiconductor memory of claim 2, wherein the NOR gate of the first tracking circuit has a first input coupled to a first tracking read bit line and a second input coupled to a second tracking read bit line, the first tracking read bit line coupled to the first tracking cell and the second tracking read bit line coupled to the second tracking cell.

4. The semiconductor memory of claim 1, wherein the first memory bank includes a third tracking cell disposed in a third tracking column, and the second memory bank includes a fourth tracking cell disposed in a fourth tracking column.

5. The semiconductor memory of claim 4, further comprising:
   a second local tracking circuit coupled to the third and fourth tracking cells, the second tracking circuit configured to output a second signal to the memory control circuitry when the third and fourth tracking cells are accessed;
   a second segment including:
   a third memory bank comprising a third plurality of memory cells, a fifth tracking cell disposed in a fifth tracking column, and a sixth tracking cell disposed in a sixth tracking column,
   a fourth memory bank comprising a fourth plurality of memory cells, a seventh tracking column including a seventh tracking cell, and an eighth tracking column including an eighth tracking cell,
   a third tracking circuit coupled to the fifth and seventh tracking cells, the third tracking circuit configured to output a third signal to the memory control circuitry when the fifth and sixth tracking cells have been accessed; and
   a fourth tracking circuit coupled to the sixth and eighth tracking cells, the fourth tracking circuit configured to output a fourth signal to the memory control circuitry when the sixth and eighth tracking cells have been accessed.

6. The semiconductor memory array of claim 5, configured to satisfy at least one of the following conditions:
   the third tracking column is disposed adjacent to the first tracking column,
   the fourth tracking column is disposed adjacent to the second tracking column, and
   the sixth tracking column is disposed adjacent to the fifth tracking column.

7. The semiconductor memory of claim 5, wherein each of the tracking circuits includes a NOR gate coupled to tracking read bit lines.

8. The semiconductor memory of claim 5, wherein the memory control circuitry is configured to set a memory clock based on the first, second, third, and fourth signals.

9. The semiconductor memory of claim 5, wherein the memory control circuitry sets the memory clock based on a last received one of the first, second, third, and fourth signals.

10. The semiconductor memory of claim 1, wherein the first and second tracking columns include memory cells.

11. The semiconductor memory of claim 1, wherein the memory cells and the tracking cells are single-ended.

12. A method, comprising:
   starting a tracking clock when a tracking signal is transmitted from a memory control circuit of a semiconductor memory;
   using a first voltage from a first tracking cell disposed in a first column of a first segment of the semiconductor memory to control a first tracking read bit line in response to receiving the tracking signal;
   using a second voltage from a second tracking cell disposed in a second column of the first segment of the semiconductor memory to control a second tracking read bit line in response to receiving the tracking signal;
   outputting a first signal to a tracking global bit line from a first tracking circuit in response to receiving the first and second voltages from the first and second tracking read bit lines; and
   generating a first reset signal for triggering a reset of the tracking clock when the first signal is received from the tracking global bit line.

13. The method of claim 12, further comprising:
   using a third voltage from a third tracking cell disposed in a third column of a first segment of the SRAM array to control a third tracking read bit line in response to receiving the tracking signal;
   using a fourth voltage from a fourth tracking cell disposed in a fourth column of the first segment of the SRAM array to control a fourth tracking read bit line in response to receiving the tracking signal;
   outputting a second signal to a second tracking global bit line from a second tracking circuit in response to receiving the third and fourth voltages from the third and fourth tracking read bit lines; and
   generating a second reset signal for triggering a reset of the tracking clock when the second signal is received from the second tracking global bit line.

14. The method of claim 13, wherein the tracking clock of the semiconductor memory is reset when a last received one of the first and second reset signals is received at the tracking clock, and a clock of the semiconductor memory is set based on the tracking clock.

15. The method of claim 13, wherein the third column is disposed adjacent to the first column and the fourth column is disposed adjacent to the second column.

16. The method of claim 12, wherein the first and second tracking cells are single ended.

17. The method of claim 12, wherein the first tracking circuit includes a NOR gate having a first input coupled to the first tracking read bit line and a second input coupled to the second tracking read bit line.

18. A semiconductor memory, comprising:
   a plurality of segments, each of the plurality of segments including:
      first and second banks of memory cells in which the memory cells are arranged in rows and columns,
      a local tracking circuit disposed between the first and second banks of memory cells, the local tracking circuit including a NOR gate having a first input coupled to a first tracking read bit line and a second input coupled to a second tracking read bit line, the first tracking read bit line coupled to a first tracking cell disposed in a first column of the first bank, the second tracking read bit line coupled to a second tracking cell disposed in a second column of the second bank,
   wherein the NOR gate has an output coupled to a global tracking bit line and is configured to trigger a reset of a tracking clock coupled to the global tracking bit line in response to receiving signals identifying that the first and second tracking cells have been accessed from the first and second tracking read bit lines.

19. The semiconductor memory of claim 18, wherein the first and second tracking cells are single-ended.

20. The semiconductor memory of claim 18, wherein a clock of the semiconductor memory is configured to be set based on a last received one of the reset signals received by the tracking clock.

* * * * *